Sept. 17, 1963 B. BIRKENES 3,104,357
RADIO RECEIVER
Filed July 5, 1960
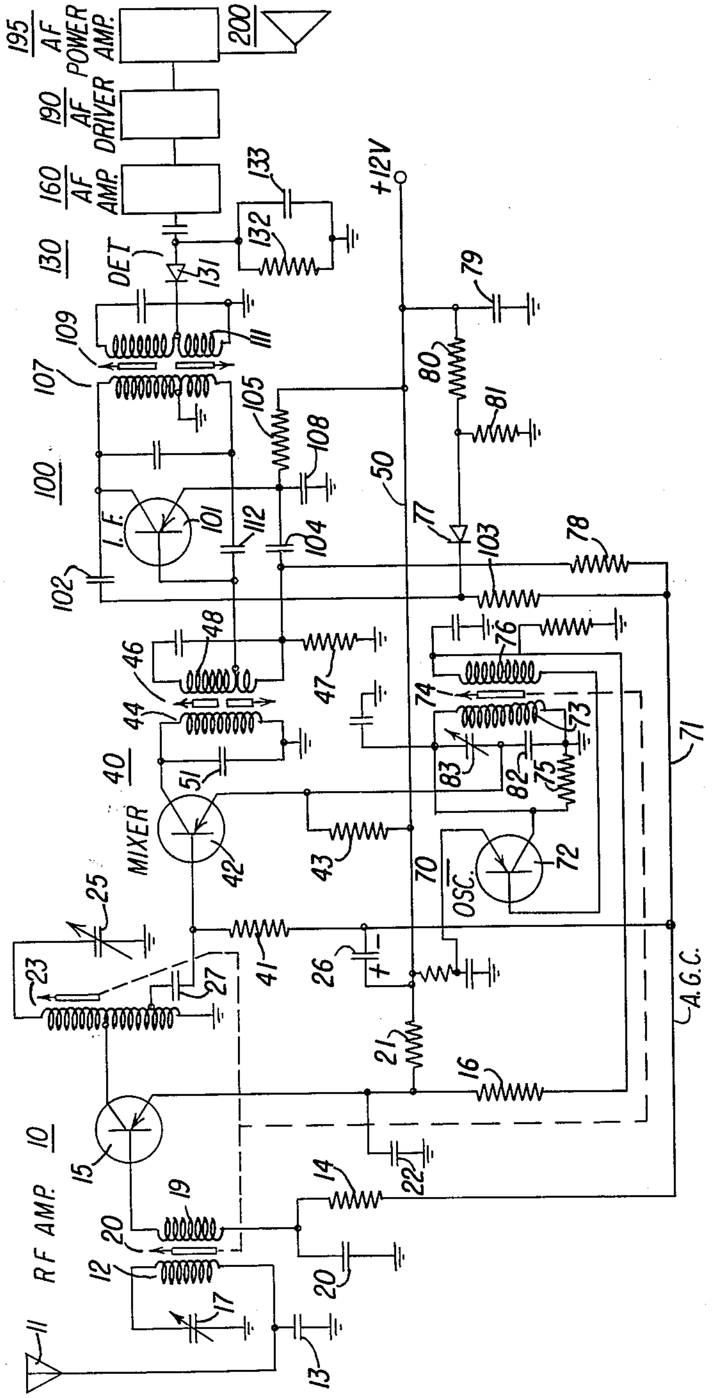
INVENTOR.
Bernhard Birkenes
BY Mueller & Aichele
Attys.

United States Patent Office 3,104,357
Patented Sept. 17, 1963

3,104,357

RADIO RECEIVER

Bernhard Birkenes, Chicago, Ill., assignor to Motorola, Inc., Chicago, Ill., a corporation of Illinois Filed July 5, 1960, Ser. No. 40,629
4 Claims. (Cl. 325—319)

This invention relates generally to transistor radio circuits and particularly to a transistor circuit wherein automatic gain control voltage is applied to the local oscillator of a superheterodyne radio receiver to prevent overload distortion.

Automatic gain control circuits long have been used in apparatus such as radio receivers to maintain a signal output which is constant over a wide range of received signal intensities. Variations which sometimes occur in intensity of the output signal of a sound reproducer such as a loudspeaker are largely eliminated by such automatic gain control circuits. These variations in output signal intensity may be caused by atmospheric conditions such as fading, or by tuning the receiver from a strong broadcast station to a weak one. Automatic gain control circuits have been used in radio receivers employing electron tubes and it is desirable to utilize automatic gain control circuits in transistorized radio receivers. However, the application of techniques used in AGC systems having electron tubes to transistor circuits becomes complex because the input impedance of transistors is lower than that of electron tubes so that more power must be delivered to successive control stages where transistors are employed.

Because of the complexity of circuits involved, the effectiveness of transistor automatic gain control systems has been limited and strong signals often overload one or more stages of a receiver thereby causing distortion.

Thus, an object of the present invention is to provide an improved automatic gain control circuit for use in a transistorized radio receiver.

Still another object of the invention is to provide a simple and inexpensive circuit which prevents distortion and gives stability to the sound reproduction of a radio receiver utilizing transistors.

A feature of the invention is the provision of an automatic gain control circuit in a transistorized radio receiver utilizing a resistance connected between the emitter of the radio frequency amplifier stage and the base of the local oscillator stage for controlling the injection signal level from the oscillator to the mixer.

Another feature of the invention is the provision of automatic gain control circuit which is connected to the input electrode of an R.F. amplifier transistor and which transistor is also D.C. coupled to the oscillator transistor for controlling the injection voltage level from the local oscillator stage to the mixer stage of a radio receiver thus regulating conversion gain of the mixer stage.

The drawing shows a radio receiver circuit, partially in schematic and partially in block diagram form, wherein the invention is utilized.

In a specific form of the invention, there is provided a transistorized automatic gain control circuit in a radio receiver to prevent overload distortion. Automatic gain control voltage from a suitable detector is applied to the base of an R.F. amplifier transistor. When a strong R.F. signal is received and AGC is applied to the base of such R.F. amplifier transistor, the emitter current of the R.F. amplifier decreases and the voltage on the emitter of the R.F. amplifier increases. The emitter voltage is transferred to the oscillator transistor base through a direct current circuit thereby increasing the bias voltage on the oscillator transistor and lowering the injection voltage from the collector of the oscillator to the emitter of the mixer stage transistor. In turn, the conversion gain of the mixer stage is decreased to reduce the overall signal level available at the mixer output.

Referring now to the drawing, an auto radio receiver circuit in combined schematic and block diagram form is shown. The general circuit operation is as follows. Radio signals are received and amplified in R.F. amplifier stage 10 and coupled to the mixer stage 40 where the R.F. signals are mixed with the output from local oscillator stage 70 to produce an intermediate frequency signal. This I.F. signal is amplified by I.F. stage 100 and detector stage 130 demodulates the audio frequency signal. Stage 160 is the first audio frequency amplifier, stage 190 is the audio frequency driver, and stage 195 is the audio frequency power amplifier. Loudspeaker 200 is coupled to stage 195 for sound reproduction.

Explaining the circuit in greater detail, radio frequency signals are received by antenna 11 and coupled by way of a pi network to the transistor 15. Signals are coupled through the primary winding 12 of tunable inductor 20 to secondary winding 19. Capacitor 17 is connected from one side of primary winding 12 to ground and capacitor 13 is connected between the other end of primary winding 12 and ground. One end of winding 19 is connected to the base of radio frequency amplifier transistor 15 for applying signals thereto. The other end of winding 19 is connected to the junction of resistor 14, and bypass capacitor 20, the associated circuit of which will be explained in greater detail later. Emitter bias voltage is taken from B+ lead 50 through bias resistor 21. Bypass capacitor 22 is connected between the emitter of transistor 15 and ground.

The collector of transistor 15 is connected to an impedance match tap of variable inductor 23, one end of which is directly grounded and the other end of which is connected through capacitor 25 to ground.

Coupling capacitor 27 is connected to an impedance match tap of inductor 23 and the base of transistor 42 in mixer stage 40. Emitter voltage is obtained from B+ lead 50 through resistor 43. Bias resistor 41 is connected between the base of transistor 42 and AGC lead 71.

Also connected to the emitter of transistor 42 is the collector output from the transistor 72 in the local oscillator stage 70. One end of winding 73 of variable inductor 74 is connected directly to the collector of transistor 72. The other end of winding 73 is grounded. Resistor 75 is connected between the collector of transistor 72 and ground. Shunted across winding 73 to form a resonant circuit therewith are series connected capacitors 82 and 83. Injection voltage is taken from the junction of capacitors 82 and 83 and applied to the emitter of mixer transistor 42. The conversion gain of the mixer stage 40 is controlled by the injection voltage from the oscillator stage 70.

The collector of transistor 42 is connected to one end of winding 44 of variable inductor 46. Capacitor 51 is also connected to the collector of transistor 42 and shunted across coil 44 with their junction being connected to ground. The signal induced in winding 48 is taken from a tap and applied to the base of I.F. transistor 101. Bypass capacitor 103 is connected between the emitter and ground and resistor 105 is connected between B+ lead 50 and the emitter. Capacitor 104 is connected from the bottom of winding 48 to the emitter of transistor 101. The collector of transistor 101 is connected to one end of winding 107 of variable inductor 109. A tap of winding 107 is grounded and the other end of winding 107 is connected through capacitor 112 to the base of transistor 101 to provide degenerative feedback for neutralization.

The signal induced in winding 111 of variable inductor 109 is applied from a tap to the cathode of diode 131. Resistor 132 and capacitor 133 are the detector load and are shunt connected between ground and the anode of diode 131. The demodulated audio signal is further amplified in stages 160, 190 and 195 before being applied to loudspeaker 200.

In the AGC portion of the circuit, signal voltage developed at the collector of I.F. transistor 101 is fed through capacitor 102 to the cathode of diode 77. The cathode of diode 77 is also connected through resistors 103, 78 and 47 to ground.

Capacitor 26 is connected between the junction of resistors 103 and 78 and B+ lead 50, which is at signal ground due to filter capacitor 79. Capacitor 26 bypasses radio and audio frequencies so that the positive AGC voltage on lead 71 varies in magnitude with the strength of the received signal. The AGC voltage is applied through isolating resistor 14 and coil 19 to the base of transistor 15 in the R.F. amplifier stage and through isolating resistor 78 to the base of transistor 101. Capacitors 104 and 108 are bypass capacitors respectively for base return emitter in the I.F. amplifier 100. Voltage divider resistors 80, 81 are series coupled between B+ lead 50 and ground and the junction of these resistors is coupled to the anode of diode 77. Resistors 80 and 81 provide the quiescent bias voltage for the bases of transistors 15 and 42. Thus, the base bias voltage is applied in series with the AGC potential on lead 71.

As a strong R.F. signal is applied to the base of R.F. transistor 15 as previously explained, the AGC potential on lead 71 increases driving the base of transistor 15 more positive. This reduces the gain of the R.F. stage and the emitter current of transistor 15 decreases and its emitter voltage increases. This emitter voltage is fed through resistor 16 and coil 76 of variable inductor 74 to increase the bias on the base of oscillator transistor 72. In turn, the injection voltage from the collector of oscillator transistor 72 to the emitter of mixer transistor 42 is lowered, thereby decreasing the conversion gain of mixer stage 40 and lowering the gain in that stage.

Thus, the invention provides for an improved automatic gain control circuit in a transistorized radio receiver. The improved circuit is simple with only one resistor being required in addition to the circuit elements normally found in the receiver.

I claim:

1. A transistorized radio receiver including a radio frequency amplifier stage having a first transistor with input and output electrodes, a mixer stage, a local oscillator stage for injecting a signal to said mixer stage, said local oscillator stage having a second transistor with a gain controlling electrode, detector means for producing a control signal representing the level of a received signal, first direct current coupling means coupling said detector means to said input electrode of said first transistor for variably biasing said first transistor according to the level of the received signal, second direct current coupling means coupling said output electrode of said first transistor to said gain controlling electrode of said second transistor for variably biasing said second transistor according to the level of the received signal so that the gain of said first and second transistors is reduced by said control signal and said first transistor provides an amplified control for said second transistor to control signal injection to said mixer stage and conversion gain thereof inversely with the level of the received signal.

2. A transistorized radio receiver including a radio frequency amplifier stage having a first transistor with base and emitter electrodes, a mixer stage, a local oscillator stage for injecting a signal to said mixer stage, said local oscillator stage having a second transistor with a base electrode, detector means for producing a control signal representing the level of a received signal, first direct current coupling means coupling said detector means to said base electrode of said first transistor for variably biasing said first transistor according to the level of the received signal, second direct current coupling means coupling said emitter electrode of said first transistor to said base electrode of said second transistor for variably biasing said second transistor according to the level of the received signal so that the gain of said first and second transistors is reduced by said control signal and said first transistor provides an amplified control for said second transistor to control signal injection to and the conversion gain of said mixer stage.

3. In an automatic gain control circuit including in combination, an RF amplifier stage having a first transistor with base, collector, and emitter electrodes, a local oscillator stage having a second transistor with base, collector, and emitter electrodes, a mixer stage having a third transistor with base, collector, and emitter electrodes, an I.F. amplifier stage, automatic gain control detector circuit means coupled between said I.F. amplifier stage and the base electrodes of said first and third transistors for regulating the gain of said RF amplifier and mixer stages inversely with respect to received signal strength, direct current circuit means coupling the emitter electrode of said first transistor to the base electrode of said second transistor so that the gain of said second transistor varies directly with the gain of said first transistor, third circuit means coupling the collector electrode of said oscillator transistor to the emitter electrode of said third transistor for applying oscillator signals to said mixer stage, said detector circuit means thereby controlling the emitter voltage of said first transistor to control the oscillator signal injection voltage to said third transistor thereby controlling the conversion gain thereof.

4. In a radio receiver, an RF amplifier stage having a first transistor with base, collector and emitter electrodes, a local oscillator stage having a second transistor with base, collector and emitter electrodes, a mixer stage having a third transistor with base, collector and emitter electrodes, an IF amplifier stage, an automatic gain control detector circuit coupled between said IF amplifier stage and said base electrodes of said first and third transistors for regulating the gain thereof inversely with the level of a received signal, said RF amplifier stage including a resistive voltage divider with a first point thereof connected to said emitter electrode of said first transistor, said local oscillator stage including tunable feedback inductor means with a winding thereof connected between a second point of said voltage divider means and said base electrode of said second transistor so that the gain of said second transistor varies inversely with the level of the received signal, circuit means for coupling a signal from said local oscillator stage to said mixer stage, whereby said RF amplifier stage and said mixer stage are gain controlled by said automatic gain control detector circuit and the oscillator signal injection voltage to said mixer stage is reduced upon increase of the level of the received signal to reduce the conversion gain in said mixer stage.

References Cited in the file of this patent

UNITED STATES PATENTS

| | | |
|---|---|---|
| 2,195,290 | Shofstall | Mar. 26, 1940 |
| 2,848,603 | Shultz | Aug. 19, 1958 |
| 2,885,544 | Radcliffe | May 5, 1959 |
| 2,894,125 | Frey | July 7, 1959 |